United States Patent
Khlat

(10) Patent No.: US 9,197,256 B2
(45) Date of Patent: Nov. 24, 2015

(54) REDUCING EFFECTS OF RF MIXER-BASED ARTIFACT USING PRE-DISTORTION OF AN ENVELOPE POWER SUPPLY SIGNAL

(71) Applicant: RF Micro Devices, Inc., Greensboro, NC (US)

(72) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 10 days.

(21) Appl. No.: 14/048,109

(22) Filed: Oct. 8, 2013

(65) Prior Publication Data

US 2014/0099906 A1  Apr. 10, 2014

Related U.S. Application Data

(60) Provisional application No. 61/711,014, filed on Oct. 8, 2012.

(51) Int. Cl.
| | |
|---|---|
| H04B 1/04 | (2006.01) |
| H03F 1/32 | (2006.01) |
| H03F 1/02 | (2006.01) |
| H03F 3/195 | (2006.01) |
| H03F 3/24 | (2006.01) |
| H03C 1/62 | (2006.01) |

(52) U.S. Cl.
CPC ............ *H04B 1/0475* (2013.01); *H03F 1/0227* (2013.01); *H03F 1/0266* (2013.01); *H03F 1/3241* (2013.01); *H03F 1/3247* (2013.01); *H03F 3/195* (2013.01); *H03F 3/245* (2013.01); *H03F 2200/336* (2013.01); *H04B 2001/0441* (2013.01)

(58) Field of Classification Search
CPC ............... H03F 1/3247; H04L 27/367–27/368
USPC ........................................ 455/114.3; 375/296
See application file for complete search history.

(56) References Cited

U.S. PATENT DOCUMENTS

| 3,969,682 A | 7/1976 | Rossum |
| 3,980,964 A | 9/1976 | Grodinsky |
| 4,587,552 A | 5/1986 | Chin |

(Continued)

FOREIGN PATENT DOCUMENTS

| CN | 1211355 A | 3/1999 |
| CN | 1518209 A | 8/2004 |

(Continued)

OTHER PUBLICATIONS

Final Office Action for U.S. Appl. No. 13/297,470, mailed Oct. 25, 2013, 17 pages.

(Continued)

*Primary Examiner* — Lee Nguyen
(74) *Attorney, Agent, or Firm* — Withrow & Terranova, P.L.L.C.

(57) ABSTRACT

A radio frequency (RF) power amplifier (PA) and an envelope tracking power supply are disclosed. The RF PA receives and amplifies an RF input signal to provide an RF transmit signal using an envelope power supply signal, which at least partially envelope tracks the RF transmit signal, such that the RF input signal has an RF mixer-based artifact. The envelope tracking power supply provides the envelope power supply signal, which includes mixer-based artifact pre-distortion to at least partially remove effects of the RF mixer-based artifact from the RF transmit signal.

27 Claims, 9 Drawing Sheets

(56) References Cited

U.S. PATENT DOCUMENTS

| | | | |
|---|---|---|---|
| 4,692,889 | A | 9/1987 | McNeely |
| 4,831,258 | A | 5/1989 | Paulk et al. |
| 4,996,500 | A | 2/1991 | Larson et al. |
| 5,099,203 | A | 3/1992 | Weaver et al. |
| 5,146,504 | A | 9/1992 | Pinckley |
| 5,187,396 | A | 2/1993 | Armstrong, II et al. |
| 5,311,309 | A | 5/1994 | Ersoz et al. |
| 5,317,217 | A | 5/1994 | Rieger et al. |
| 5,351,087 | A | 9/1994 | Christopher et al. |
| 5,414,614 | A | 5/1995 | Fette et al. |
| 5,420,643 | A | 5/1995 | Romesburg et al. |
| 5,457,620 | A | 10/1995 | Dromgoole |
| 5,486,871 | A | 1/1996 | Filliman et al. |
| 5,532,916 | A | 7/1996 | Tamagawa |
| 5,541,547 | A | 7/1996 | Lam |
| 5,581,454 | A | 12/1996 | Collins |
| 5,646,621 | A | 7/1997 | Cabler et al. |
| 5,715,526 | A | 2/1998 | Weaver, Jr. et al. |
| 5,767,744 | A | 6/1998 | Irwin et al. |
| 5,822,318 | A | 10/1998 | Tiedemann, Jr. et al. |
| 5,898,342 | A | 4/1999 | Bell |
| 5,905,407 | A | 5/1999 | Midya |
| 5,936,464 | A | 8/1999 | Grondahl |
| 6,043,610 | A | 3/2000 | Buell |
| 6,043,707 | A | 3/2000 | Budnik |
| 6,055,168 | A | 4/2000 | Kotowski et al. |
| 6,070,181 | A | 5/2000 | Yeh |
| 6,118,343 | A | 9/2000 | Winslow et al. |
| 6,133,777 | A | 10/2000 | Savelli |
| 6,141,541 | A | 10/2000 | Midya et al. |
| 6,147,478 | A | 11/2000 | Skelton et al. |
| 6,198,645 | B1 | 3/2001 | Kotowski et al. |
| 6,204,731 | B1 | 3/2001 | Jiang et al. |
| 6,256,482 | B1 | 7/2001 | Raab |
| 6,300,826 | B1 | 10/2001 | Mathe et al. |
| 6,313,681 | B1 | 11/2001 | Yoshikawa |
| 6,348,780 | B1 | 2/2002 | Grant |
| 6,400,775 | B1 | 6/2002 | Gourgue et al. |
| 6,483,281 | B2 | 11/2002 | Hwang |
| 6,559,689 | B1 | 5/2003 | Clark |
| 6,566,935 | B1 | 5/2003 | Renous |
| 6,583,610 | B2 | 6/2003 | Groom et al. |
| 6,617,930 | B2 | 9/2003 | Nitta |
| 6,621,808 | B1 | 9/2003 | Sadri |
| 6,624,712 | B1 | 9/2003 | Cygan et al. |
| 6,658,445 | B1 | 12/2003 | Gau et al. |
| 6,681,101 | B1 | 1/2004 | Eidson et al. |
| 6,690,652 | B1 | 2/2004 | Sadri |
| 6,701,141 | B2 | 3/2004 | Lam |
| 6,703,080 | B2 | 3/2004 | Reyzelman et al. |
| 6,728,163 | B2 | 4/2004 | Gomm et al. |
| 6,744,151 | B2 | 6/2004 | Jackson et al. |
| 6,819,938 | B2 | 11/2004 | Sahota |
| 6,885,176 | B2 | 4/2005 | Librizzi |
| 6,958,596 | B1 | 10/2005 | Sferrazza et al. |
| 6,995,995 | B2 | 2/2006 | Zeng et al. |
| 7,038,536 | B2 | 5/2006 | Cioffi et al. |
| 7,043,213 | B2 | 5/2006 | Robinson et al. |
| 7,053,718 | B2 | 5/2006 | Dupuis et al. |
| 7,058,373 | B2 | 6/2006 | Grigore |
| 7,099,635 | B2 | 8/2006 | McCune |
| 7,164,893 | B2 | 1/2007 | Leizerovich et al. |
| 7,170,341 | B2 | 1/2007 | Conrad et al. |
| 7,200,365 | B2 | 4/2007 | Watanabe et al. |
| 7,233,130 | B1 | 6/2007 | Kay |
| 7,253,589 | B1 | 8/2007 | Potanin et al. |
| 7,254,157 | B1 | 8/2007 | Crotty et al. |
| 7,262,658 | B2 | 8/2007 | Ramaswamy et al. |
| 7,279,875 | B2 | 10/2007 | Gan et al. |
| 7,348,847 | B2 | 3/2008 | Whittaker |
| 7,394,233 | B1 | 7/2008 | Trayling et al. |
| 7,405,618 | B2 | 7/2008 | Lee et al. |
| 7,411,316 | B2 | 8/2008 | Pai |
| 7,414,330 | B2 | 8/2008 | Chen |
| 7,515,885 | B2 | 4/2009 | Sander et al. |
| 7,528,807 | B2 | 5/2009 | Kim et al. |
| 7,529,523 | B1 | 5/2009 | Young et al. |
| 7,539,466 | B2 | 5/2009 | Tan et al. |
| 7,595,569 | B2 | 9/2009 | Amerom et al. |
| 7,609,114 | B2 | 10/2009 | Hsieh et al. |
| 7,615,979 | B2 | 11/2009 | Caldwell |
| 7,627,622 | B2 | 12/2009 | Conrad et al. |
| 7,646,108 | B2 | 1/2010 | Paillet et al. |
| 7,653,366 | B2 | 1/2010 | Grigore |
| 7,679,433 | B1 | 3/2010 | Li |
| 7,684,216 | B2 | 3/2010 | Choi et al. |
| 7,696,735 | B2 | 4/2010 | Oraw et al. |
| 7,715,811 | B2 * | 5/2010 | Kenington ............... 455/127.1 |
| 7,724,837 | B2 | 5/2010 | Filimonov et al. |
| 7,755,431 | B2 | 7/2010 | Sun |
| 7,764,060 | B2 | 7/2010 | Wilson |
| 7,773,691 | B2 | 8/2010 | Khlat et al. |
| 7,777,459 | B2 | 8/2010 | Williams |
| 7,782,036 | B1 | 8/2010 | Wong et al. |
| 7,783,269 | B2 | 8/2010 | Vinayak et al. |
| 7,800,427 | B2 | 9/2010 | Chae et al. |
| 7,805,115 | B1 | 9/2010 | McMorrow et al. |
| 7,852,150 | B1 | 12/2010 | Arknaes-Pedersen |
| 7,856,048 | B1 | 12/2010 | Smaini et al. |
| 7,859,336 | B2 | 12/2010 | Markowski et al. |
| 7,880,547 | B2 | 2/2011 | Lee et al. |
| 7,894,216 | B2 | 2/2011 | Melanson |
| 7,898,268 | B2 | 3/2011 | Bernardon et al. |
| 7,898,327 | B2 | 3/2011 | Nentwig |
| 7,907,010 | B2 | 3/2011 | Wendt et al. |
| 7,915,961 | B1 | 3/2011 | Li |
| 7,920,023 | B2 | 4/2011 | Witchard |
| 7,923,974 | B2 | 4/2011 | Martin et al. |
| 7,965,140 | B2 | 6/2011 | Takahashi |
| 7,994,864 | B2 | 8/2011 | Chen et al. |
| 8,000,117 | B2 | 8/2011 | Petricek |
| 8,008,970 | B1 | 8/2011 | Homol et al. |
| 8,022,761 | B2 | 9/2011 | Drogi et al. |
| 8,026,765 | B2 | 9/2011 | Giovannotto |
| 8,044,639 | B2 | 10/2011 | Tamegai et al. |
| 8,054,126 | B2 | 11/2011 | Yang et al. |
| 8,068,622 | B2 | 11/2011 | Melanson et al. |
| 8,081,199 | B2 | 12/2011 | Takata et al. |
| 8,093,951 | B1 | 1/2012 | Zhang et al. |
| 8,159,297 | B2 | 4/2012 | Kumagai |
| 8,164,388 | B2 | 4/2012 | Iwamatsu |
| 8,174,313 | B2 | 5/2012 | Vice |
| 8,183,917 | B2 | 5/2012 | Drogi et al. |
| 8,183,929 | B2 | 5/2012 | Grondahl |
| 8,198,941 | B2 | 6/2012 | Lesso |
| 8,204,456 | B2 | 6/2012 | Xu et al. |
| 8,242,813 | B1 | 8/2012 | Wile et al. |
| 8,253,485 | B2 | 8/2012 | Clifton |
| 8,253,487 | B2 | 8/2012 | Hou et al. |
| 8,274,332 | B2 | 9/2012 | Cho et al. |
| 8,289,084 | B2 | 10/2012 | Morimoto et al. |
| 8,362,837 | B2 | 1/2013 | Koren et al. |
| 8,541,993 | B2 | 9/2013 | Notman et al. |
| 8,542,061 | B2 | 9/2013 | Levesque et al. |
| 8,548,398 | B2 | 10/2013 | Baxter et al. |
| 8,558,616 | B2 | 10/2013 | Shizawa et al. |
| 8,588,713 | B2 | 11/2013 | Khlat |
| 8,611,402 | B2 | 12/2013 | Chiron |
| 8,618,868 | B2 | 12/2013 | Khlat et al. |
| 8,624,576 | B2 | 1/2014 | Khlat et al. |
| 8,624,760 | B2 | 1/2014 | Ngo et al. |
| 8,626,091 | B2 | 1/2014 | Khlat et al. |
| 8,638,165 | B2 | 1/2014 | Shah et al. |
| 8,648,657 | B1 | 2/2014 | Rozenblit |
| 8,659,355 | B2 | 2/2014 | Henshaw et al. |
| 8,717,100 | B2 | 5/2014 | Reisner et al. |
| 8,718,582 | B2 | 5/2014 | See et al. |
| 8,744,382 | B2 | 6/2014 | Hou et al. |
| 8,824,978 | B2 | 9/2014 | Briffa et al. |
| 8,829,993 | B2 | 9/2014 | Briffa et al. |
| 8,909,175 | B1 | 12/2014 | McCallister |
| 8,947,162 | B2 | 2/2015 | Wimpenny et al. |
| 8,981,847 | B2 | 3/2015 | Balteanu |
| 8,994,345 | B2 | 3/2015 | Wilson |

(56) References Cited

U.S. PATENT DOCUMENTS

| | | |
|---|---|---|
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0132424 A1* | 7/2004 | Aytur et al. .................... 455/335 |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1* | 12/2007 | Woo et al. .................... 330/149 |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0135043 A1 | 5/2013 | Hietala et al. |
| 2013/0147445 A1 | 6/2013 | Levesque et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0049321 A1 | 2/2014 | Gebeyehu et al. |

FOREIGN PATENT DOCUMENTS

| | | |
|---|---|---|
| CN | 1898860 A | 1/2007 |
| CN | 101201891 A | 6/2008 |
| CN | 101379695 A | 3/2009 |
| CN | 101416385 A | 4/2009 |
| CN | 101427459 A | 5/2009 |
| CN | 101626355 A | 1/2010 |
| CN | 101635697 A | 1/2010 |
| CN | 101867284 A | 10/2010 |
| EP | 0755121 A2 | 1/1997 |

(56) References Cited

FOREIGN PATENT DOCUMENTS

| | | | |
|---|---|---|---|
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.

(56) References Cited

OTHER PUBLICATIONS

Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm$\Lambda$2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.
Extended European Search Report for application 06740532.4, mailed Dec. 7, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.

(56) References Cited

OTHER PUBLICATIONS

Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.
European Search Report for European Patent Application No. 14190851.7, issued Mar. 5, 2015, 6 pages.
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Notice of Allowance for U.S. Appl. No. 13/747,725, mailed Feb. 2, 2015, 10 pages.
Notice of Allowance for U.S. Appl. No. 14/072,140, mailed Dec. 2, 2014, 8 pages.
First Office Action for Chinese Patent Application No. 201280026559.0, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Corrected Notice of Allowance for U.S. Appl. No. 13/297,470, mailed Jun. 5, 2015, 11 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
European Examination Report for European Patent Application No. 14162682.0, mailed May 22, 2015, 5 pages.
International Preliminary Report on Patentability for PCT/US2013/065403, mailed Apr. 30, 2015, 8 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 14/072,140, mailed Aug. 20, 2015, 6 pages.

(56) References Cited

OTHER PUBLICATIONS

Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
Second Office Action for Chinese Patent Application No. 201180030273.5, issued Aug. 14, 2015, 8 pages.

* cited by examiner

REDUCING EFFECTS OF RF MIXER-BASED ARTIFACT USING PRE-DISTORTION OF AN ENVELOPE POWER SUPPLY SIGNAL

RELATED APPLICATIONS

This application claims the benefit of U.S. provisional patent application No. 61/711,014, filed Oct. 8, 2012, the disclosure of which is hereby incorporated herein by reference in its entirety.

FIELD OF THE DISCLOSURE

Embodiments of the present disclosure relate to switching power supplies, radio frequency (RF) power amplifiers, and RF system control circuitry, all of which may be used in RF communication systems.

BACKGROUND

RF emissions from RF transmit signals in cellular communications systems must be low enough to prevent RF receive problems in the cellular communications system and to prevent interference in non-cellular communications systems. Such RF emissions may be called RF spectral emissions since these emissions typically fall outside of a desired RF spectrum. RF spectral emissions may have a number of sources. For example, an RF transmit signal may originate from a complex RF modulator, which may include one or more RF mixers. As such, RF mixers may introduce RF mixer-based artifact into the RF transmit signal, thereby causing RF spectral emissions. Thus, there is a need to reduce effects of RF mixer-based artifact.

SUMMARY

Embodiments of the present disclosure relate to a radio frequency (RF) power amplifier (PA) and an envelope tracking power supply. The RF PA receives and amplifies an RF input signal to provide an RF transmit signal using an envelope power supply signal, which at least partially envelope tracks the RF transmit signal, such that the RF input signal has an RF mixer-based artifact. The envelope tracking power supply provides the envelope power supply signal, which includes mixer-based artifact pre-distortion to at least partially remove effects of the RF mixer-based artifact from the RF transmit signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure relate to an RF power amplifier (PA) and an envelope tracking power supply. The RF PA receives and amplifies an RF input signal to provide an RF transmit signal using an envelope power supply signal, which at least partially envelope tracks the RF transmit signal, such that the RF input signal has an RF mixer-based artifact. The envelope tracking power supply provides the envelope power supply signal, which includes mixer-based artifact pre-distortion to at least partially remove effects of the RF mixer-based artifact from the RF transmit signal.

Figure 1:
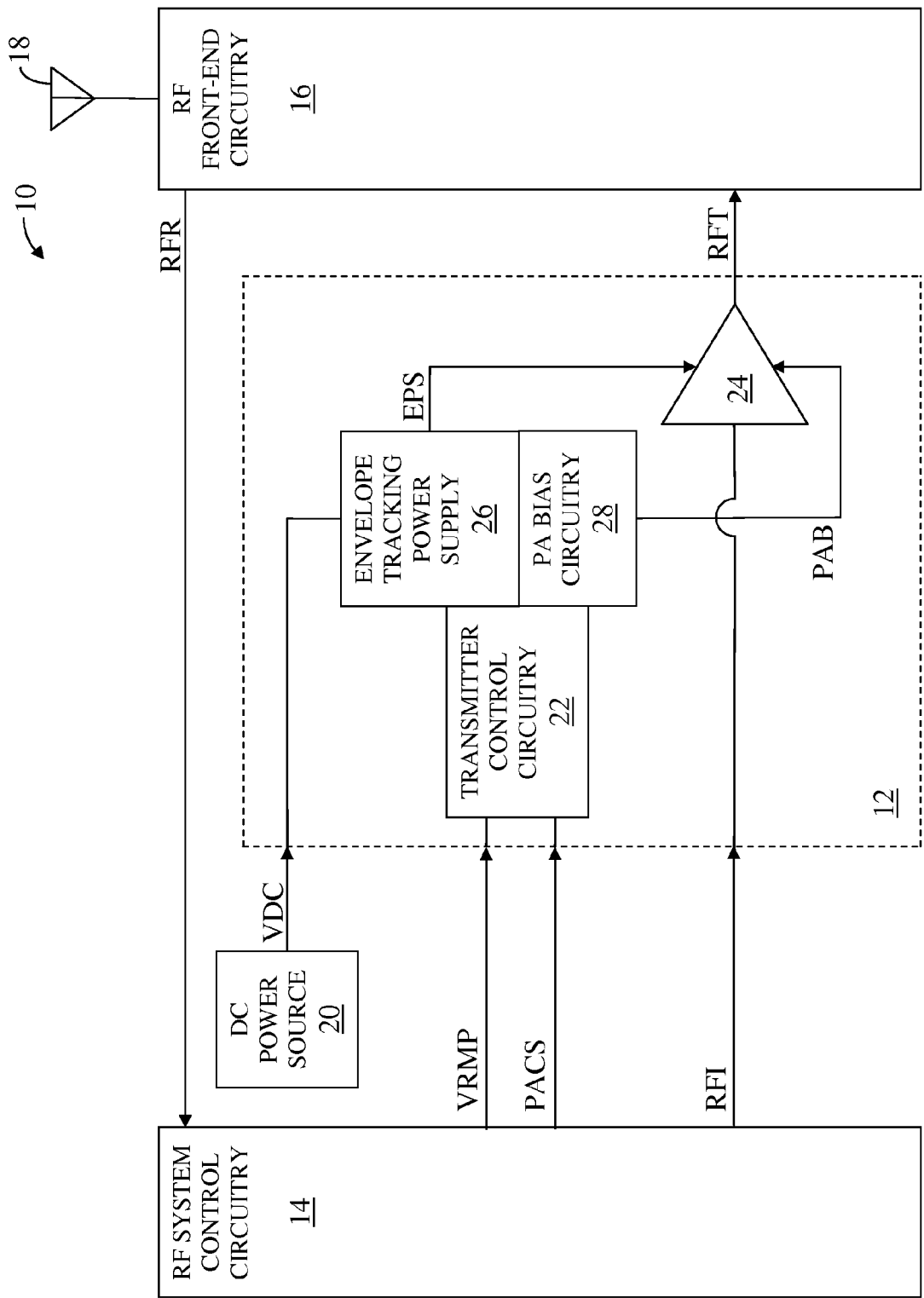
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. Further, in one embodiment of the envelope tracking power supply 26, the RF input signal RFI has an RF mixer-based artifact and the envelope power supply signal EPS at least partially envelope tracks the RF transmit signal RFT. Further, the envelope power supply signal EPS includes mixer-based artifact pre-distortion to at least partially remove effects of the RF mixer-based artifact from the RF transmit signal RFT.

The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS. The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF communications system 10, the RF communications system 10 simultaneously receives and transmits the RF receive signal RFR and the RF transmit signal RFT, respectively. As such, the RF receive signal RFR and the RF transmit signal RFT are full-duplex RF signals.

In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

Figure 2:
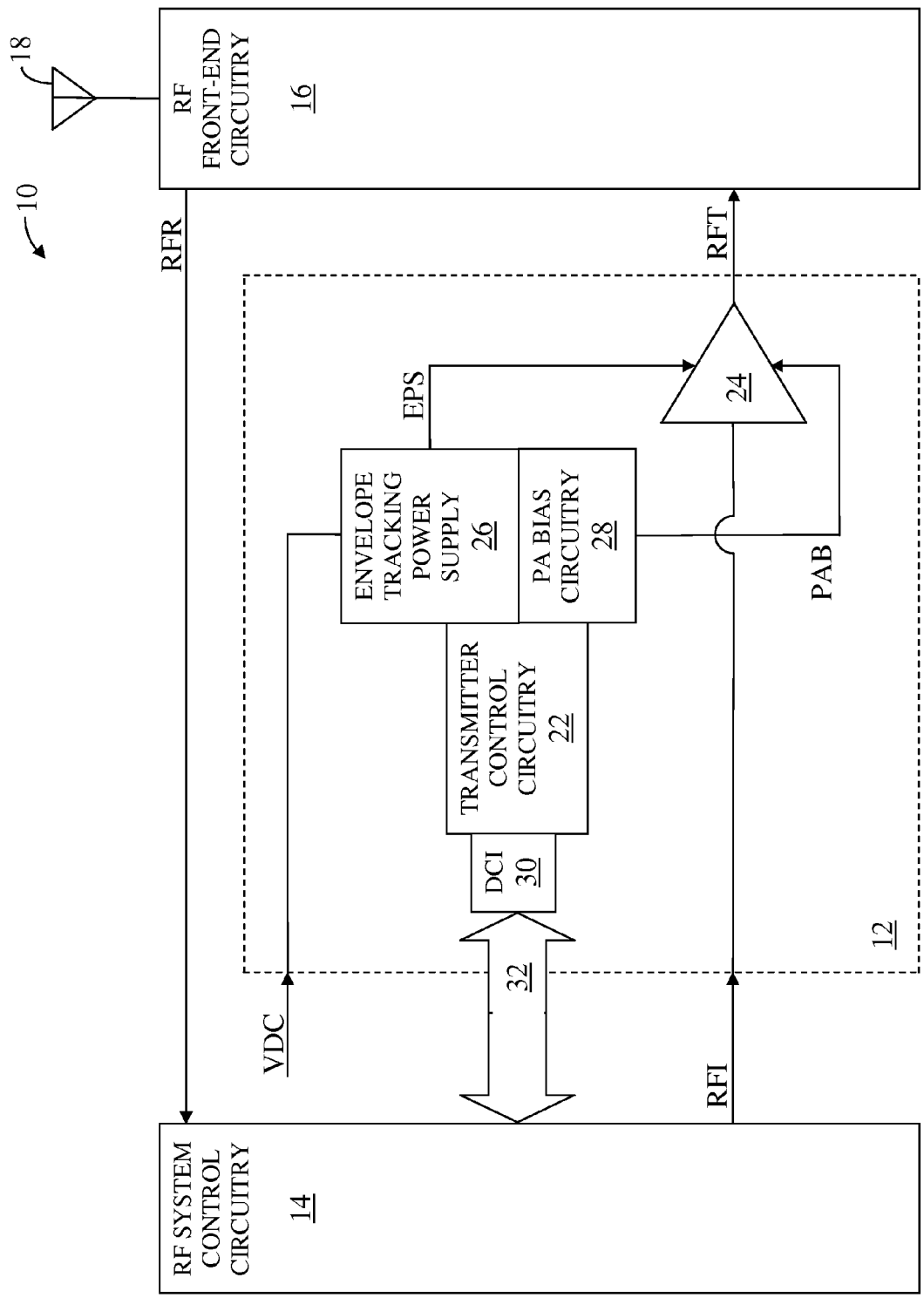
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

Figure 3:
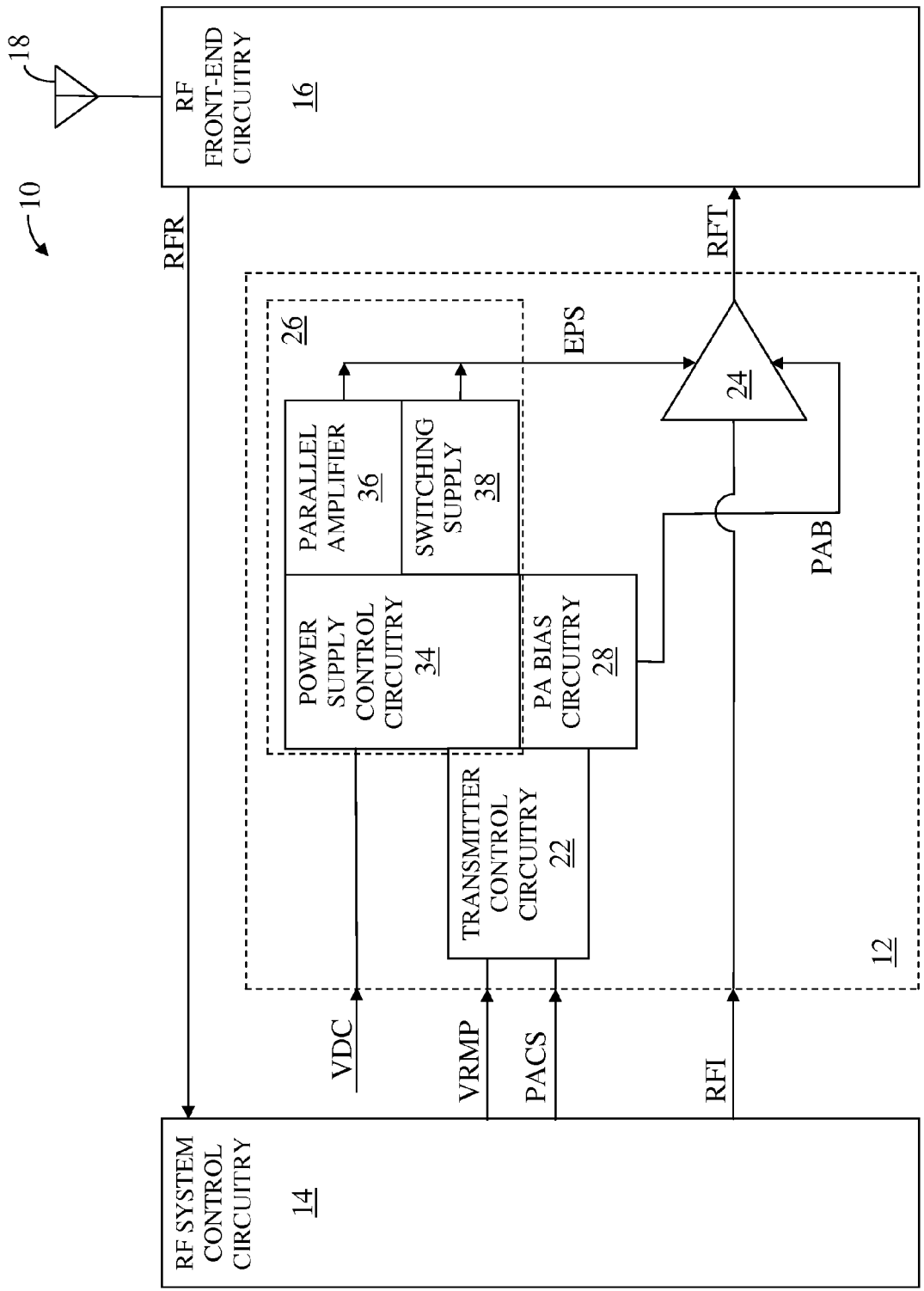
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 34, a parallel amplifier 36, and a switching supply 38. The power supply control circuitry 34 controls the parallel amplifier 36 and the switching supply 38. The parallel amplifier 36 and the switching supply 38 provide the envelope power supply signal EPS, such that the parallel amplifier 36 partially provides the envelope power supply signal EPS and the switching supply 38 partially provides the envelope power supply signal EPS. The switching supply 38 may provide power more efficiently than the parallel amplifier 36. However, the parallel amplifier 36 may provide the envelope power supply signal EPS more accurately than the switching supply 38. As such, the parallel amplifier 36 regulates a voltage of the envelope power supply signal EPS based on the setpoint of the envelope power supply signal EPS, and the switching supply 38 operates to drive an output current from the parallel amplifier 36 toward zero to maximize efficiency. In this regard, the parallel amplifier 36 behaves like a voltage source and the switching supply 38 behaves like a current source.

Figure 4:
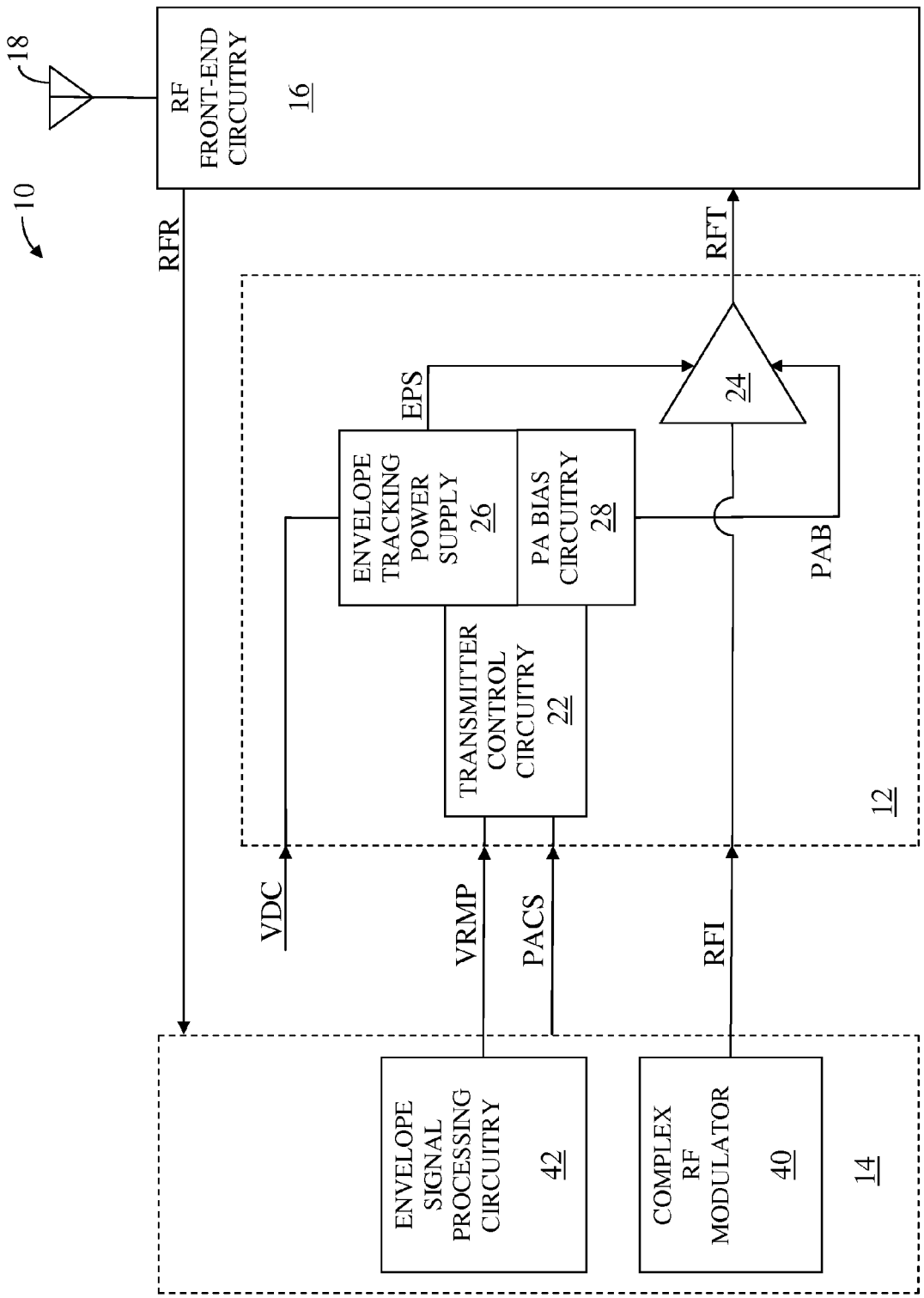
FIG. 4 shows details of RF system control circuitry illustrated in FIG. 1 according to one embodiment of the RF system control circuitry.

FIG. 4 shows details of RF system control circuitry 14 illustrated in FIG. 1 according to one embodiment of the RF system control circuitry 14. The RF system control circuitry 14 illustrated in FIG. 4 is similar to the RF system control circuitry 14 illustrated in FIG. 1, except the RF system control circuitry 14 illustrated in FIG. 4 includes a complex RF modulator 40 and envelope signal processing circuitry 42. The complex RF modulator 40 provides the RF input signal RFI to the RF PA 24. As such, the complex RF modulator 40 is external to the RF transmitter circuitry 12.

The envelope signal processing circuitry 42 provides the envelope power supply control signal VRMP to the transmitter control circuitry 22. As such, the envelope power supply signal EPS and the mixer-based artifact pre-distortion are both based on the envelope power supply control signal VRMP. In general, the envelope power supply signal EPS is based on the envelope signal processing circuitry 42. In one embodiment of the RF communications system 10, the RF communications system 10 receives the RF receive signal RFR, such that the effects of the RF mixer-based artifact include receiver de-sensitization of the RF communications system 10.

Figure 5:
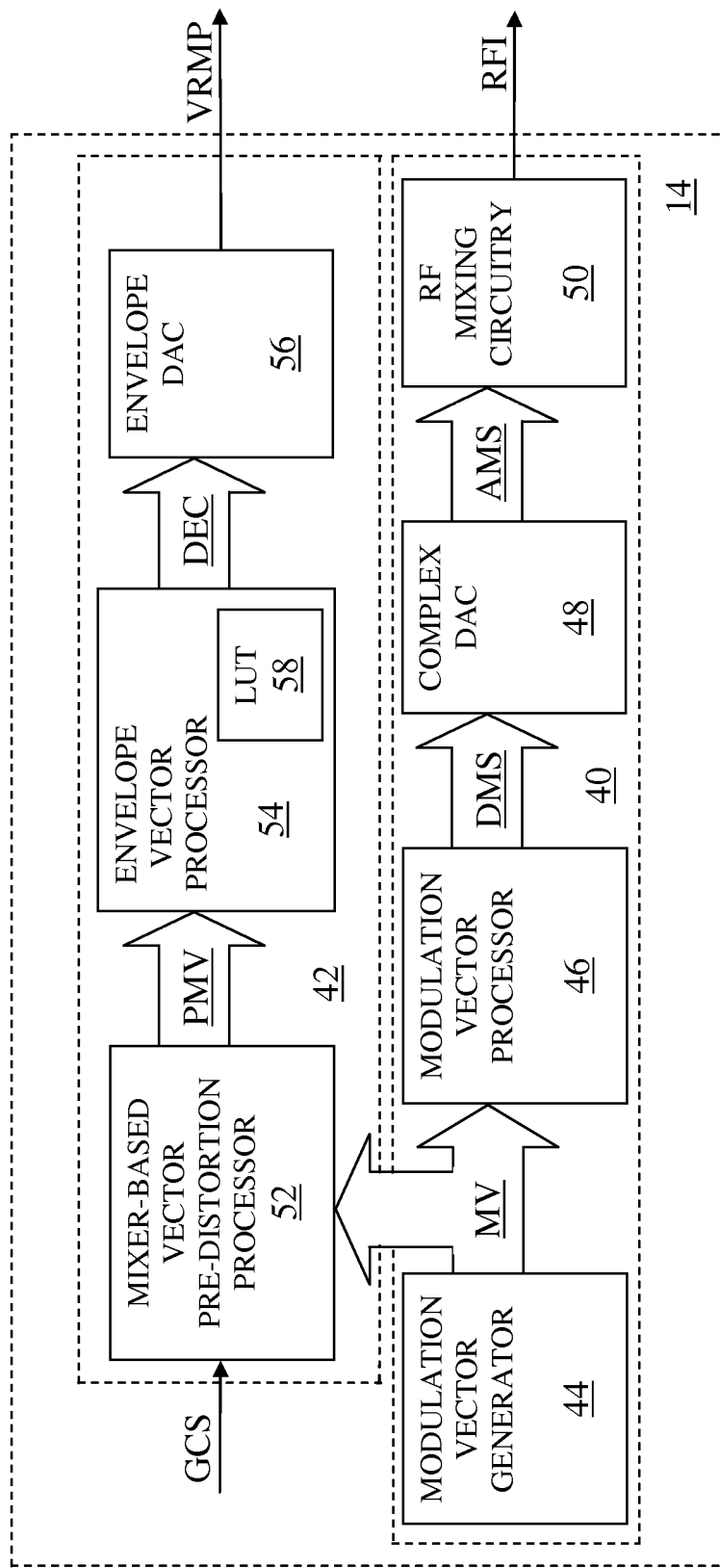
FIG. 5 shows details of the RF system control circuitry illustrated in FIG. 4 according to an alternate embodiment of the RF system control circuitry.

FIG. 5 shows details of the RF system control circuitry 14 illustrated in FIG. 4 according to an alternate embodiment of the RF system control circuitry 14. The RF system control circuitry 14 illustrated in FIG. 5 includes the complex RF modulator 40 and the envelope signal processing circuitry 42. The complex RF modulator 40 includes a modulation vector generator 44, a modulation vector processor 46, a complex digital-to-analog converter (DAC) 48, and RF mixing circuitry 50. The envelope signal processing circuitry 42 includes a mixer-based vector pre-distortion processor 52, an envelope vector processor 54, and an envelope DAC 56. The envelope vector processor 54 includes at least one look-up-table (LUT) 58. In an alternate embodiment of the envelope vector processor 54, the LUT 58 is omitted.

The modulation vector generator 44 provides modulation vectors MV to the modulation vector processor 46 and to the mixer-based vector pre-distortion processor 52. The modulation vectors MV are representative of modulation of the RF input signal RFI. The modulation vector processor 46 processes the modulation vectors MV to provide complex digital modulation signals DMS to the complex DAC 48 In this regard, the modulation vector processor 46 may control gain, control signal delay, apply amplitude pre-distortion, apply phase pre-distortion, the like, or any combination thereof. The complex DAC 48 performs a DAC conversion of the complex digital modulation signals DMS to provide complex analog modulation signals AMS to the RF mixing circuitry 50. The RF mixing circuitry 50 modulates at least one RF carrier signal using the complex analog modulation signals AMS to provide the RF input signal RFI.

The mixer-based vector pre-distortion processor 52 receives a gain control signal GCS, which is used to control a magnitude of the envelope power supply signal EPS (FIG. 4). Since the RF input signal RFI has the RF mixer-based artifact, the modulation vectors MV are used to create the mixer-based artifact pre-distortion. In this regard, the mixer-based vector pre-distortion processor 52 combines and pre-processes the modulation vectors MV and the gain control signal GCS to provide pre-processed modulation vectors PMV to the envelope vector processor 54.

The envelope vector processor 54 processes the pre-processed modulation vectors PMV to provide a digital envelope control signal DEC. As such, the envelope vector processor 54 may process the pre-processed modulation vectors PMV, as needed, may operate in conjunction with the modulation vector processor 46 as needed, or both. In this regard, the envelope vector processor 54 may use the at least one LUT 58, as needed, to provide the digital envelope control signal DEC. The envelope vector processor 54 may control gain, may control signal delay, the like, or any combination thereof. In one embodiment of the envelope vector processor 54, the mixer-based artifact pre-distortion is based on the at least one LUT 58.

The envelope DAC 56 receives and performs a DAC conversion of the digital envelope control signal DEC to provide the envelope power supply control signal VRMP. In one embodiment of the envelope power supply control signal VRMP, the envelope power supply control signal VRMP is a single-ended signal. In an alternate embodiment of the envelope power supply control signal VRMP, the envelope power supply control signal VRMP is a differential signal. In an alternate embodiment of the envelope signal processing circuitry 42, the envelope DAC 56 is omitted, such that the envelope power supply control signal VRMP is provided via the digital communications bus 32 (FIG. 2).

Figure 6:
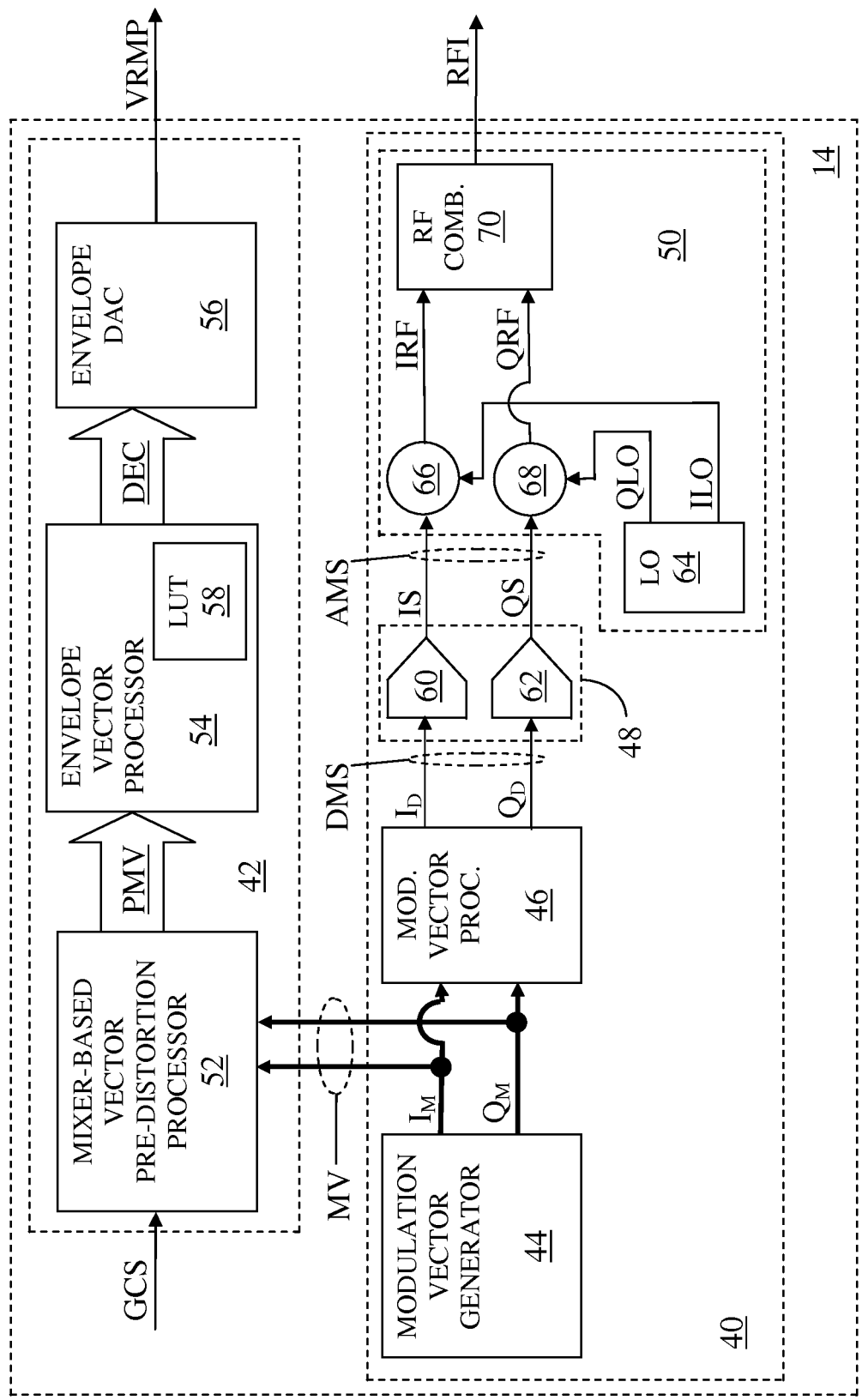
FIG. 6 shows details of a complex RF modulator illustrated in FIG. 5 according to an alternate embodiment of the complex RF modulator.

FIG. 6 shows details of the complex RF modulator 40 illustrated in FIG. 5 according to an alternate embodiment of the complex RF modulator 40. The complex RF modulator 40 illustrated in FIG. 6 is a quadrature RF modulator. The complex RF modulator 40 illustrated in FIG. 6 is similar to the complex RF modulator 40 illustrated in FIG. 5, except in the complex RF modulator 40 illustrated in FIG. 6, the complex DAC 48 includes an in-phase DAC 60 and a quadrature-phase DAC 62, and the RF mixing circuitry 50 includes a local oscillator 64, an in-phase mixer 66, a quadrature-phase mixer 68, and an RF combiner 70. The RF mixing circuitry 50 illustrated in FIG. 6 is quadrature RF mixing circuitry. Further, the modulation vectors MV include an in-phase modulation vector $I_M$ and a quadrature-phase modulation vector $Q_M$, the complex digital modulation signals DMS includes an in-phase digital modulation signal $I_D$ and a quadrature-phase digital modulation signal $Q_D$, and the complex analog modulation signals AMS include an in-phase modulation signal IS and a quadrature-phase modulation signal QS.

The in-phase DAC 60 receives and DAC converts the in-phase digital modulation signal $I_D$ to provide the in-phase modulation signal IS. The quadrature-phase DAC 62 receives and DAC converts the quadrature-phase digital modulation signal $Q_D$ to provide the quadrature-phase modulation signal QS. The local oscillator 64 provides an in-phase local oscillator signal ILO to the in-phase mixer 66. The local oscillator 64 provides a quadrature-phase local oscillator signal QLO to the quadrature-phase mixer 68. The in-phase local oscillator signal ILO and the quadrature-phase local oscillator signal QLO are both RF signals. In one embodiment of the in-phase local oscillator signal ILO and the quadrature-phase local oscillator signal QLO, the in-phase local oscillator signal ILO and the quadrature-phase local oscillator signal QLO are phase-shifted from one another by about 90 degrees.

The in-phase mixer 66 mixes the in-phase modulation signal IS and the in-phase local oscillator signal ILO to provide an in-phase RF signal IRF to the RF combiner 70. The quadrature-phase mixer 68 mixes the quadrature-phase modulation signal QS and the quadrature-phase local oscillator signal QLO to provide a quadrature-phase RF signal QRF to the RF combiner 70. The RF combiner 70 combines the in-phase RF signal IRF and the quadrature-phase RF signal QRF to provide the RF input signal RFI.

In this regard, the in-phase mixer 66 and the quadrature-phase mixer 68 form a quadrature RF mixer. As such, in one embodiment of the complex RF modulator 40, the complex RF modulator 40 includes the quadrature RF mixer, such that the RF input signal RFI and the RF mixer-based artifact are both based on the quadrature RF mixer. In one embodiment of the complex RF modulator 40, the RF mixer-based artifact is based on a DC offset of the quadrature RF mixer. In one embodiment of the complex RF modulator 40, the RF mixer-based artifact includes intermodulation content 100 (FIG. 9) produced by the quadrature RF mixer. In one embodiment of the complex RF modulator 40, desired frequency content 90 (FIG. 8) of the RF input signal RFI and the RF mixer-based artifact are both based on the quadrature RF mixer.

In one embodiment of the RF system control circuitry 14, the modulation vectors MV are represented as quadrature vectors, as shown in EQ. 1 below.

$$MV = I_M + jQ_M \qquad \text{EQ. 1:}$$

Figure 8:
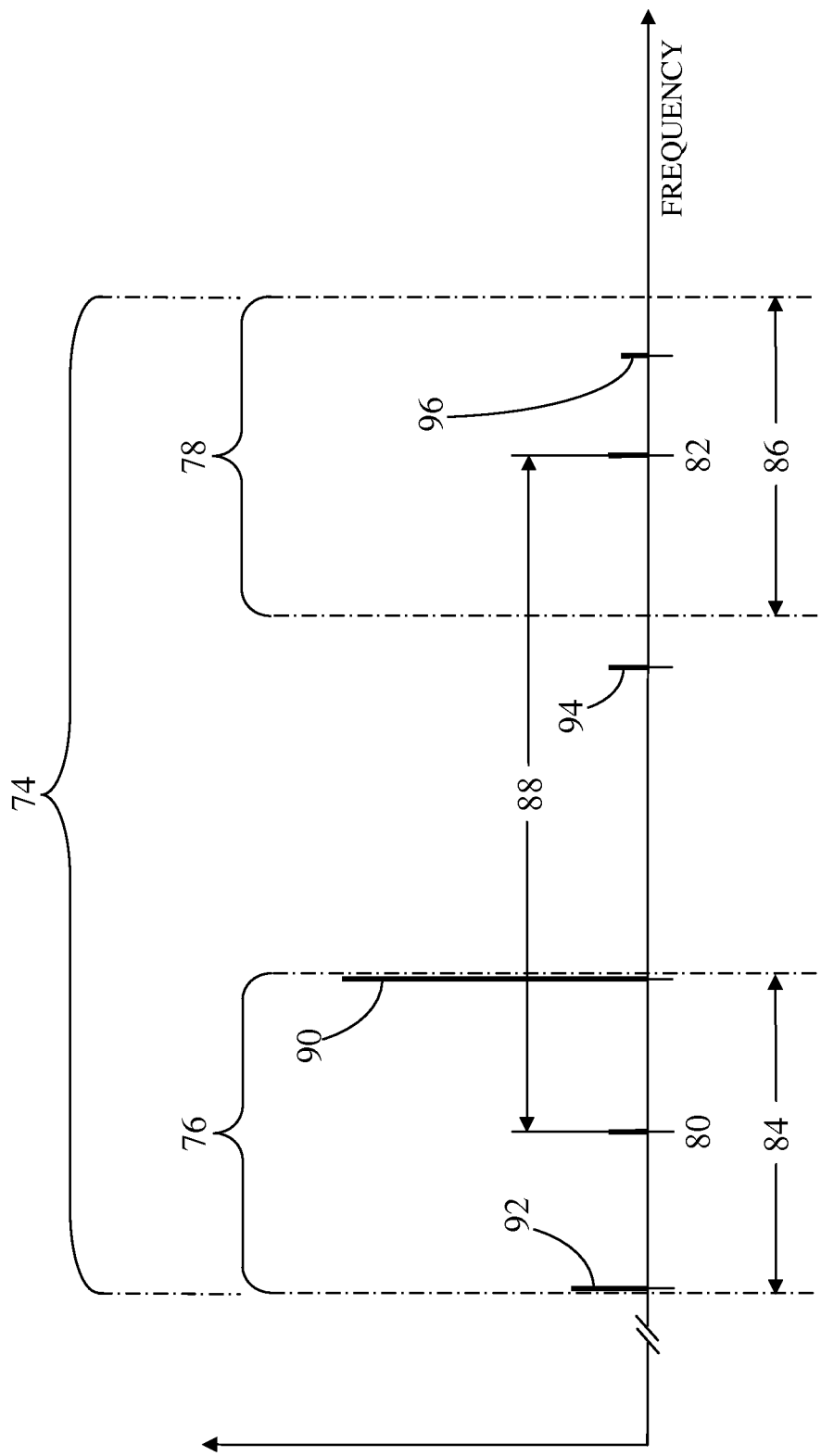
FIG. 8 is a graph illustrating a cellular communications band associated with the RF communications system illustrated in FIG. 4 according to one embodiment of the RF communications system.

However, the quadrature RF mixer may produce both the desired frequency content 90 (FIG. 8) and an image 92 (FIG. 8) of the desired frequency content 90 (FIG. 8). The image 92 (FIG. 8) may be represented as image vectors IV, which are the complex conjugate of the modulation vectors MV, as shown in EQ. 2 below.

$$IV = I_M - jQ_M \qquad \text{EQ. 2:}$$

A complex image correction factor CF is shown in EQ. 3 below.

$$CF = A_I * e^{j\phi I}, \qquad \text{EQ. 3:}$$

where $A_I$ is an amplitude portion of the correction factor CF and $\phi I$ is a phase portion of the correction factor CF. As such, in one embodiment of the RF system control circuitry 14, pre-distorted vectors PV are based on adding a corrected version of the image vectors IV to the modulation vectors MV, as shown in EQ. 4 below.

$$PV = MV + (IV * CF) = (I_M + jQ_M) + (I_M - jQ_M) * A_I * e^{j\phi I}. \qquad \text{EQ. 4:}$$

Figure 7:
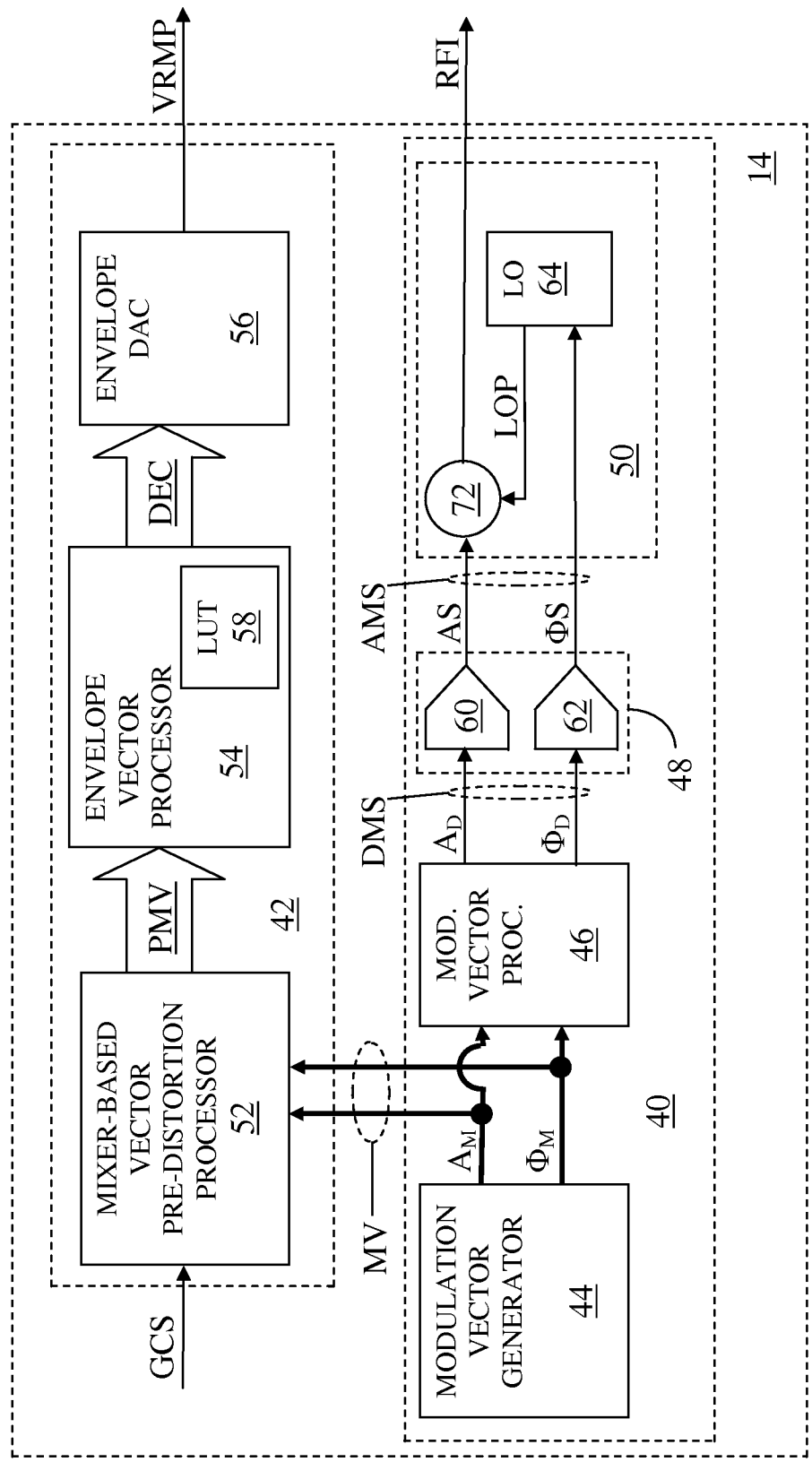
FIG. 7 shows details of the complex RF modulator illustrated in FIG. 5 according to another embodiment of the complex RF modulator.

FIG. 7 shows details of the complex RF modulator 40 illustrated in FIG. 5 according to another embodiment of the complex RF modulator 40. The complex RF modulator 40 illustrated in FIG. 7 is a polar RF modulator. The complex RF modulator 40 illustrated in FIG. 7 is similar to the complex RF modulator 40 illustrated in FIG. 6, except in the complex RF modulator 40 illustrated in FIG. 7, the RF mixing circuitry 50 is polar RF mixing circuitry instead of quadrature RF mixing circuitry. As such, the modulation vectors MV are polar modulation vectors instead of quadrature modulation vectors.

In this regard, an amplitude modulation vector $A_M$ and a phase modulation vector $\phi_M$ replace the in-phase modulation vector $I_M$ and the quadrature-phase modulation vector $Q_M$, respectively. A digital amplitude modulation signal $A_D$ and a digital phase modulation signal $\phi_D$ replace the in-phase digital modulation signal $I_D$ and the quadrature-phase digital modulation signal $Q_D$, respectively. An amplitude modulation signal AS and a phase modulation signal φS replace the in-phase modulation signal IS and the quadrature-phase modulation signal QS, respectively.

The RF mixing circuitry 50 includes the local oscillator 64 and an RF mixer 72. The local oscillator 64 receives the phase modulation signal φS and provides a phase-modulated local oscillator signal LOP based on the phase modulation signal φS. As such, a phase of the phase-modulated local oscillator signal LOP is based on the phase modulation signal φS. The RF mixer 72 receives the phase-modulated local oscillator signal LOP and the amplitude modulation signal AS. As such, the RF mixer 72 mixes the amplitude modulation signal AS and the phase-modulated local oscillator signal LOP to provide the RF input signal RFI.

FIG. 8 is a graph illustrating a cellular communications band 74 associated with the RF communications system 10 illustrated in FIG. 4 according to one embodiment of the RF communications system 10. In one embodiment of the RF communications system 10, the RF communications system 10 simultaneously receives and transmits the RF receive signal RFR (FIG. 4) and the RF transmit signal RFT (FIG. 4), respectively. As such, the RF receive signal RFR (FIG. 4) and the RF transmit signal RFT (FIG. 4) are full-duplex RF signals.

The cellular communications band 74 includes a transmit channel 76 and a receive channel 78. The transmit channel 76 is associated with the RF transmit signal RFT (FIG. 4) and the receive channel 78 is associated with the RF receive signal RFR (FIG. 4). The transmit channel 76 has a transmit channel center frequency 80 and the receive channel 78 has a receive channel center frequency 82. The transmit channel 76 has a transmit channel bandwidth 84 and the receive channel 78 has a receive channel bandwidth 86. A duplex offset 88 is a difference between the transmit channel center frequency 80 and the receive channel center frequency 82.

In one embodiment of the RF communications system 10, while transmitting using certain RF communications protocols, such as some 3G and 4G protocols, the RF input signal RFI (FIG. 4) has a bandwidth that is significantly less than the transmit channel bandwidth 84. In the embodiment illustrated in FIG. 8, the RF input signal RFI (FIG. 4) has a desired frequency content 90, which has a fairly narrow bandwidth compared to the transmit channel bandwidth 84 and is toward an upper end of the transmit channel bandwidth 84. However, the RF input signal RFI (FIG. 4) also includes an image 92 of the desired frequency content 90. The image 92 has a fairly narrow bandwidth compared to the transmit channel bandwidth 84 and is toward a lower end of the transmit channel bandwidth 84. The RF mixer-based artifact in the RF input signal RFI (FIG. 4) includes intermodulation content 100 (FIG. 9) produced by the quadrature RF mixer (FIG. 4). The intermodulation content 100 (FIG. 9) and non-linearity of the RF PA 24 (FIG. 4) combine to provide an image foldover 94 of the image 92. While the image foldover 94 illustrated in FIG. 8 does not fall within the receive channel 78, a harmonic 96 of the image foldover 94 does fall within the receive channel 78. As such, reception of the RF receive signal RFR (FIG. 4) may be compromised. To at least partially remove effects of the image foldover 94, the envelope power supply signal EPS (FIG. 4) includes mixer-based artifact pre-distortion.

Figure 9:
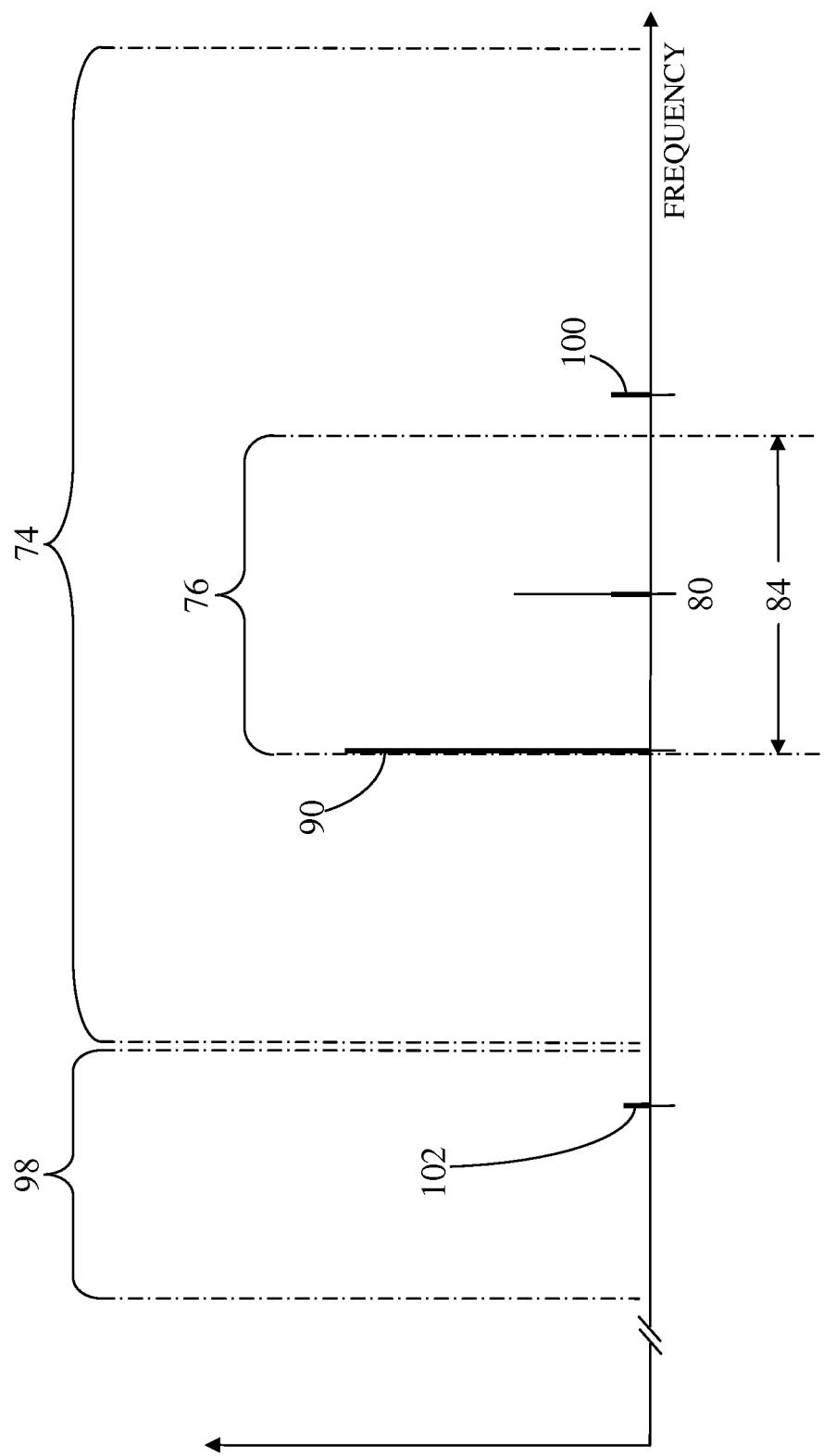
FIG. 9 is a graph illustrating a cellular communications band and a non-cellular communications band associated with the RF communications system illustrated in FIG. 4 according to one embodiment of the RF communications system.

In the embodiment of the RF communications system 10 illustrated in FIG. 8, the receive channel center frequency 82 is greater than the transmit channel center frequency 80. In an alternate embodiment of the RF communications system 10 (not shown), the receive channel center frequency 82 is less than the transmit channel center frequency 80. In an alternate embodiment of the RF communications system 10 (FIG. 4) (not shown), the image foldover 94 falls within the receive channel 78. In an alternate embodiment of the RF communications system 10 (FIG. 4) (not shown), the image foldover 94 falls within a non-cellular communications band 98 (FIG. 9). In an alternate embodiment of the RF communications system 10 (FIG. 4) (not shown), a harmonic of the image foldover 94 falls within a non-cellular communications band 98 (FIG. 9). In one embodiment of the non-cellular communications band 98 (FIG. 9), the non-cellular communications band 98 (FIG. 9) is a Personal Handy-phone System (PHS) band.

In an alternate embodiment of the RF communications system 10 (FIG. 4) (not shown), the RF mixer-based artifact includes the image 92 of the desired frequency content 90 of the RF input signal RFI (FIG. 4). In an alternate embodiment of the RF communications system 10 (FIG. 4) (not shown), the image 92 of the desired frequency content 90 of the RF input signal RFI (FIG. 4) falls within the receive channel 78. In an alternate embodiment of the RF communications system 10 (FIG. 4) (not shown), the image 92 of the desired frequency content 90 of the RF input signal RFI (FIG. 4) falls within a non-cellular communications band 98 (FIG. 9). In an alternate embodiment of the RF communications system 10 (FIG. 4) (not shown), a harmonic 96 of the image 92 of the desired frequency content 90 of the RF input signal RFI (FIG. 4) falls within the receive channel 78. In an alternate embodiment of the RF communications system 10 (FIG. 4) (not shown), a harmonic 96 of the image 92 of the desired frequency content 90 of the RF input signal RFI (FIG. 4) falls within a non-cellular communications band 98 (FIG. 9).

FIG. 9 is a graph illustrating the cellular communications band 74 and a non-cellular communications band 98 associated with the RF communications system 10 illustrated in FIG. 4 according to one embodiment of the RF communications system 10. The cellular communications band 74 illustrated in FIG. 9 is similar to the cellular communications band 74 illustrated in FIG. 8, except the cellular communications band 74 illustrated in FIG. 9 does not show the receive channel 78. Further, the desired frequency content 90 of the RF input signal RFI (FIG. 4) is toward a lower end of the transmit channel bandwidth 84. The RF mixer-based artifact includes the intermodulation content 100 produced by the quadrature RF mixer (FIG. 6). The intermodulation content 100 and non-linearity of the RF PA 24 (FIG. 4) combine to provide a folding image 102 of the desired frequency content 90 of the RF input signal RFI (FIG. 4). The folding image 102 falls within the non-cellular communications band 98. As such, the folding image 102 may interfere with operations within the non-cellular communications band 98.

In one embodiment of the non-cellular communications band 98, the non-cellular communications band 98 is a PHS band. In an alternate embodiment of the RF communications system 10 (FIG. 4) (not shown), the folding image 102 falls within the receive channel 78 (FIG. 8).

Those skilled in the art will recognize improvements and modifications to the embodiments of the present disclosure. All such improvements and modifications are considered within the scope of the concepts disclosed herein and the claims that follow.

What is claimed is:
1. Circuitry comprising:
A radio frequency (RF) power amplifier (PA) configured to receive and amplify an RF input signal to provide an RF transmit signal using an envelope power supply signal, which at least partially envelope tracks the RF transmit signal, wherein the RF input signal has a desired fre- quency content and an RF mixer-based artifact that includes an image of the desired frequency content; and
an envelope tracking power supply configured to provide the envelope power supply signal, which includes mixer-based artifact pre-distortion to at least partially remove effects of the RF mixer-based artifact from the RF transmit signal.

2. The circuitry of claim 1 wherein a complex RF modulator is configured to provide the RF input signal.

3. The circuitry of claim 2 further comprising the complex RF modulator.

4. The circuitry of claim 2 further comprising RF transmitter circuitry, which comprises the RF PA and the envelope tracking power supply, such that the complex RF modulator is external to the RF transmitter circuitry.

5. The circuitry of claim 1 wherein a complex RF modulator comprises a quadrature RF mixer, such that the RF input signal and the RF mixer-based artifact are both produced by the quadrature RF mixer.

6. The circuitry of claim 5 wherein the RF mixer-based artifact is based on a DC offset of the quadrature RF mixer.

7. The circuitry of claim 1 further comprising an RF communications system, which comprises the RF PA and the envelope tracking power supply.

8. The circuitry of claim 7 wherein the RF communications system is configured to receive an RF receive signal, such that the effects of the RF mixer-based artifact comprise receiver de-sensitization of the RF communications system.

9. The circuitry of claim 8 wherein the RF receive signal and the RF transmit signal are full-duplex RF signals.

10. The circuitry of claim 7 wherein the RF communications system further comprises a complex RF modulator and envelope signal processing circuitry, such that the complex RF modulator comprises a quadrature RF mixer; the RF input signal and the RF mixer-based artifact are both produced by the quadrature RF mixer; and the envelope power supply signal is based on the envelope signal processing circuitry.

11. The circuitry of claim 7 wherein the RF input signal and the RF mixer-based artifact are both produced by a quadrature RF mixer, and the envelope power supply signal is based on envelope signal processing circuitry.

12. The circuitry of claim 11 wherein the envelope signal processing circuitry is configured to provide an envelope power supply control signal, such that the envelope power supply signal and the mixer-based artifact pre-distortion are both based on the envelope power supply control signal.

13. The circuitry of claim 12 wherein the envelope signal processing circuitry comprises at least one look-up table (LUT), such that the mixer-based artifact pre-distortion is further based on the at least one LUT.

14. The circuitry of claim 1 wherein the image of the desired frequency content falls within an RF receive channel.

15. The circuitry of claim 1 wherein a harmonic of the image of the desired frequency content falls within an RF receive channel.

16. The circuitry of claim 1 wherein a harmonic of the image of the desired frequency content falls within a non-cellular communications band.

17. Circuitry comprising:
a radio frequency (RF) power amplifier (PA) configured to receive and amplify an RF input signal to provide an RF transmit signal using an envelope power supply signal, which at least partially envelope tracks the RF transmit signal, wherein the RF input signal has a desired frequency content and an RF mixer-based artifact; and
an envelope tracking power supply configured to provide the envelope power supply signal, which includes mixer-based artifact pre-distortion to at least partially remove effects of the RF mixer-based artifact from the RF transmit signal, wherein:
a complex RF modulator comprises a quadrature RF mixer, such that the desired frequency content and the RF mixer-based artifact are both produced by the quadrature RF mixer;
the RF mixer-based artifact comprises intermodulation content produced by the quadrature RF mixer; and
the intermodulation content and a non-linearity of the RF PA combine to provide an image foldover of an image of the desired frequency content of the RF input signal.

18. The circuitry of claim 17 wherein the image foldover falls within an RF receive channel.

19. The circuitry of claim 17 wherein a harmonic of the image foldover falls within an RF receive channel.

20. The circuitry of claim 17 wherein the image foldover falls within a non-cellular communications band.

21. The circuitry of claim 17 wherein a harmonic of the image foldover falls within a non-cellular communications band.

22. The circuitry of claim 21 wherein the non-cellular communications band is a Personal Handy-phone System (PHS) band.

23. Circuitry comprising:
a radio frequency (RF) power amplifier (PA) configured to receive and amplify an RF input signal to provide an RF transmit signal using an envelope power supply signal, which at least partially envelope tracks the RF transmit signal, wherein the RF input signal has a desired frequency content and an RF mixer-based artifact; and
an envelope tracking power supply configured to provide the envelope power supply signal, which includes mixer-based artifact pre-distortion to at least partially remove effects of the RF mixer-based artifact from the RF transmit signal, wherein:
a complex RF modulator comprises a quadrature RF mixer, such that the desired frequency content and the RF mixer-based artifact are both produced by the quadrature RF mixer;
the RF mixer-based artifact comprises intermodulation content produced by the quadrature RF mixer; and
the intermodulation content and a non-linearity of the RF PA combine to provide a folding image of the desired frequency content of the RF input signal.

24. The circuitry of claim 23 wherein the folding image falls within an RF receive channel.

25. The circuitry of claim 23 wherein the folding image falls within a non-cellular communications band.

26. The circuitry of claim 25 wherein the non-cellular communications band is a Personal Handy-phone System (PHS) band.

27. A method comprising:
receiving and amplifying a radio frequency (RF) input signal to provide an RF transmit signal using an envelope power supply signal, which at least partially envelope tracks the RF transmit signal, wherein the RF input signal has a desired frequency content and an RF mixer-based artifact that includes an image of the desired frequency content; and
providing the envelope power supply signal, which includes mixer-based artifact pre-distortion to at least partially remove effects of the RF mixer-based artifact from the RF transmit signal.

* * * * *